(12) United States Patent
Chieh et al.

(10) Patent No.: US 7,394,246 B2
(45) Date of Patent: Jul. 1, 2008

(54) SUPERCONDUCTIVE QUANTUM INTERFERENCE DEVICE (SQUID) SYSTEM FOR MEASURING MAGNETIC SUSCEPTIBILITY OF MATERIALS

(76) Inventors: Jen-Jie Chieh, No. 4, Lane 75, Mingchuan Rd., Gushan District, Kaohsiung 804 (TW); Chin-Yih Rex Hong, 4F., No. 31, Lane 57, Ta Tze St., Ta Tze, Taipei 104 (TW); Herng-Er Horng, 4F., No. 31, Lane 57, Ta Tze St., Ta Tze, Taipei 104 (TW); Hong-Chang Yang, 4F., No. 31, Lane 57, Ta Tze St., Ta Tze, Taipei 104 (TW); Shieh-Yueh Yang, 12F., No. 427, Siyuan Rd., Sindian City, Taipei County 231 (TW)

( * ) Notice: Subject to any disclaimer, the term of this patent is extended or adjusted under 35 U.S.C. 154(b) by 0 days.

(21) Appl. No.: 11/563,035

(22) Filed: Nov. 24, 2006

(65) Prior Publication Data

US 2008/0122434 A1    May 29, 2008

(51) Int. Cl.
G01R 33/12    (2006.01)
G01N 27/72    (2006.01)
(52) U.S. Cl. .................. 324/248; 324/201; 324/228
(58) Field of Classification Search ......... 324/232–243, 324/248, 260, 228, 201
See application file for complete search history.

(56) References Cited

U.S. PATENT DOCUMENTS 3,826,972 A * 7/1974 Day et al. ................... 324/313
5,537,037 A * 7/1996 Otaka et al. ................. 324/240
5,731,703 A * 3/1998 Bernstein et al. ............ 324/256
6,437,563 B1 * 8/2002 Simmonds et al. .......... 324/239

OTHER PUBLICATIONS

A. H. Miklich, D. Koelle, F. Ludwig, D T. Nemeth, E. Dantsker, and J. Clarke, "Picovoltmeter based on a high transition temperature SQUID," Appl. Phys. Lett., 66, 230-232 (1995).

C. Carr, A. Cochran, J. Kuznik, D. Mca. McKirdy, and G. B. Donaldson, "Electronics gradiometry for NDE in an unshielded environment with stationary and moving HTS SQUIDs," Cryogenics, 36, 691-695 (1996).

(Continued)

*Primary Examiner*—Reena Aurora
(74) *Attorney, Agent, or Firm*—Jianq Chyun IP Office

(57) ABSTRACT

A superconductive quantum interference device (SQUID) system is provided for measuring the alternating current (AC) magnetic susceptibility of material at a single frequency or a mixing frequency from multiple frequencies, such as $mf_1 + nf_2$, where $f_1$ and $f_2$ are two excitation frequencies of two primary coils. The system includes a magnetic-flux sourcing unit for producing an AC magnetic flux on a sample and a magnetic-flux reading unit for reading the induced magnetic flux from the sample via a magnetic flux transformer. The magnetic-flux reading unit includes a SQUID set for detecting the induced magnetic flux, so as to obtain the magnetic susceptibility of the sample in converting calculation.

15 Claims, 4 Drawing Sheets

OTHER PUBLICATIONS

T. Q. Yang and K. Enpuku, "High Tc superconducting quantum interference device magnetometer utilizing cooled copper pickup coil and resonant coupling circuit," Jpn. J. Appl. Phys., 41, L1221-L1223 (2002).

T. Kondo and H. Itozaki, "Normal conducting transfer coil for SQUID NDE," Supercond. Sci. Technol., 17, 459-462 (2004).

Chi-Yih Hong, C. C. Wu, Y. C. Chiu, S. Y. Yang, H. E. Horng and H. C. Yang, "Magnetic susceptibility reduction method for magnetically labeled immunoassay," Appl. Phys. Lett., 88, 212512-1~212512-3 (2006).

* cited by examiner

SUPERCONDUCTIVE QUANTUM INTERFERENCE DEVICE (SQUID) SYSTEM FOR MEASURING MAGNETIC SUSCEPTIBILITY OF MATERIALS

BACKGROUND OF THE INVENTION

1. Field of Invention

The present invention relates to measuring magnetic susceptibility of material. More particularly, the present invention relates to measuring magnetic susceptibility of material by a superconductive quantum interference device.

2. Description of Related Art

The superconductive quantum interference device (SQUID) has been known with the high capability for sensing magnetic flux, so that many kinds of magnetic detection systems using the SQUIDs have been developed. With its high sensitivity on magnetic flux, SQUID element has been applied to detect very small magnetic signal, such as the magnetic signals generated by bio-activity or nano-blocks, for example.

FIGS. 1A-1C are drawings, schematically illustrating several types of the SQUID design. In FIG. 1A, A SQUID 100 is usually fabricated on a substrate. The substrate has a boundary 101. The boundary 101, for example, forms two grain regions 102a and 102b with a grain boundary. Alternatively for example, the two regions 102a and 102b may have a step height to form a step boundary. The SQUID 100 has the superconductive film as shown in FIG. 1A by shading. The SQUID 100 includes two Josephson junctions 110 connected in parallel. The electrode lead 104a is deposited on the substrate at the region 102a, usually having two lead terminals. One terminal I 108 is for applying a current through the Josephson junctions 110 and the other terminal V 106 is for detecting an induced voltage signal. The electrode lead 104b is grounded.

The basic characteristics of SQUID is introduced as follows. When a bias current a little higher than the critical current is injected at the terminal I 108 and flows through the Josephson junctions 110, the Josephson junctions become resistively shunted junctions and a voltage across the Josephson junctions occurs. Due to the Meissener effect of superconductive material, when an external magnetic flux is shone onto a SQUID, a circulating current through these two junctions is induced to compensate the external magnetic flux within the area enclosed with the superconducting ring having these two Josephson junctions. Thus, an induced current by the external magnetic flux is generated to flow through the effectively shunted resistors of the Josephson junctions. As a result, the voltage detected at the terminal V 106 varies due to the application of an external magnetic flux. The voltage cross the junctions is a periodic function in response to the applied magnetic flux.

In FIG. 1B, with the SQUID design in FIG. 1A, two superconductive coils are connected to the SQUID element so as to have two detection regions 90a and 90b. If the magnetic field is not uniform, then the detection regions 90a and 90b produces unbalance effect. As a result, a magnetic gradient can be detected by the gradiometer. The proceeding SQUID is operated in directly biased current (DC) mode. However, further example in FIG. 1C, a radio-frequency (RF) SQUID magnetometer can be designed. The LC resonant circuit 94 can detect the magnetic field shone onto the superconductive coil 92 with a Josephson junction inserted in the ring. Further, if the superconductive coil 92 is replaced with two coils, which share a common Josephson junction, then a RF SQUID gradiometer can be obtained. The SQUID can be designed in various ways.

By utilizing the ability of SQUID to sense the magnetic flux, especially very weak magnetic flux, various SQUID-based systems have been developed in different aspect of applications, such as magnetocardography, magnetoencephalography, non-destructive detection, picovoltmeter, etc. However, the property of SQUID-based AC magnetic susceptibility $\chi_{AC}$ has not yet been considered. The present invention is more directed to the measurement of AC magnetic susceptibility $\chi_{AC}$.

SUMMARY OF THE INVENTION

The invention provides a SQUID system for measuring magnetic susceptibility of a material. Since the SQUID element is used, the sensitivity is significantly improved.

The invention provides a superconductive quantum interference device (SQUID) system for measuring magnetic susceptibility of a material. The SQUID system includes a magnetic-flux sourcing unit, which has an excitation coil set and a pick-up coil set. The excitation coil set supplies a varying magnetic flux on the material and the pick-up coil set senses an induced magnetic flux from the material. A magnetic-field transfer route is coupled to the pick-up coil set for transferring the induced magnetic flux to a location where the magnetic-flux reading blocks is seated. A magnetic-flux reading unit has at least a SQUID set at the location to sense the induced magnetic flux, and an electronic circuit block to read the induced magnetic flux from the SQUID set.

In other words, the proceeding embodiment of the SQUID system includes the sensing block and the reading blocks, which are coupled together by a magnetic-field transfer unit. As a result, the magnetic susceptibility property of a sample material can be detected.

Alternatively, the invention provides a SQUID system for measuring magnetic susceptibility, including a pick-up coil set at an environment with a varying magnetic field, so as to produce an induced current. A transforming element is coupled to the pick-up coil set for transferring the induced current to a location, wherein the induced current flows through a coil loop to produce an induced magnetic field. A SQUID unit is at the location to detect the magnetic field.

It should be understood that both the proceeding general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the invention, a SQUID system for measuring varying magnetic field is provided. Because the magnetic field H(t) is varying with time, the varying magnetic field also produces a varying magnetic flux, which induces a current on a loop.

For a material being magnetized, the magnetic susceptibility $\chi$ is a usual parameter to describe the magnetic property of the material. Particularly, when an AC magnetic field $H_{AC}$ with a desired frequency, which may be a single frequency or a mixing frequency, is applied on a sample material. The susceptibility $\chi_{AC}$ of the material is defined by $\chi_{AC}=M_{AC}/H_{AC}$, where $M_{AC}$ is the AC magnetization of the detected material under an applied AC magnetic field $H_{AC}$. AC magnetization is not only an important quantity to denote the magnetic property of the material, but also an indicator to characterize the amount of targeted material marked with magnetic markers, such as magnetically labeled immunoassay. The $M_{AC}$ in conventional manner may be measured by an open-end Faraday coil. However, the $M_{AC}$ can also be measured by the invention with improved sensitivity. Some embodiments are provided for describing the features of the invention but not for limiting the invention.

Figure 2:
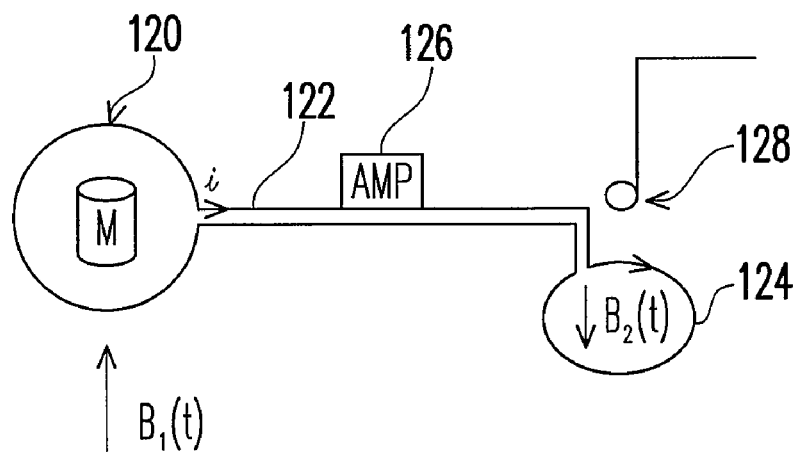
FIG. 2 is a drawing, schematically illustrating an operation mechanism of a SQUID system, according to an embodiment of the invention.

FIG. 2 is a drawing, schematically illustrating an operation mechanism of a SQUID system, according to an embodiment of the invention. In FIG. 2, the invention proposes a SQUID system, which can at least measure the $M_{AC}$ of a material in high sensitivity. The SQUID system of the invention for measuring magnetic susceptibility includes, for example, a pick-up coil set 120 posited at an environment with a varying magnetic induction $B_1(t)$, so as to produce an induced current "i" on the pick-up coil set 120. The pick-up coil set 120 can be, for example, a single loop coil or a solenoid coil, or even a pair of solenoids with opposite winding direction as to be described in FIG. 3. In further application, for example, a material with the pick-up coil set 120 is also magnetized by the varying magnetic induction $B_1(t)$, and produces a magnetization M. The varying magnetic induction $B_1(t)$, for example, is an AC magnetic field with a desired frequency. This magnetization $M_{AC}$ is then produced, according to the electromagnetic phenomenon. The quantity of $M_{AC}$ also accordingly changes the induced current "i". In other words, the induced current carries the information of the $M_{AC}$. Then, the susceptibility can also be indirectly measured. The measuring mechanism, as an example, will be further described later.

Figure 1A:
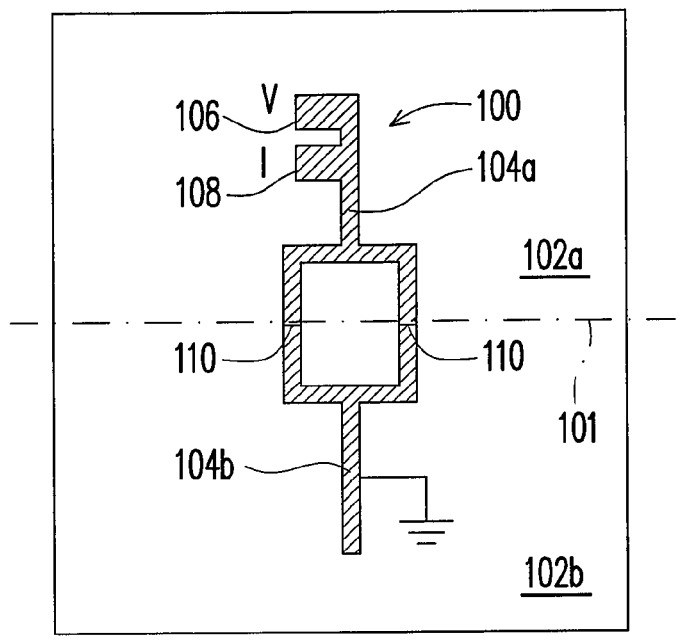
FIGS. 1A-1C are drawings, schematically illustrating several types of the SQUID design.
Figure 1B:
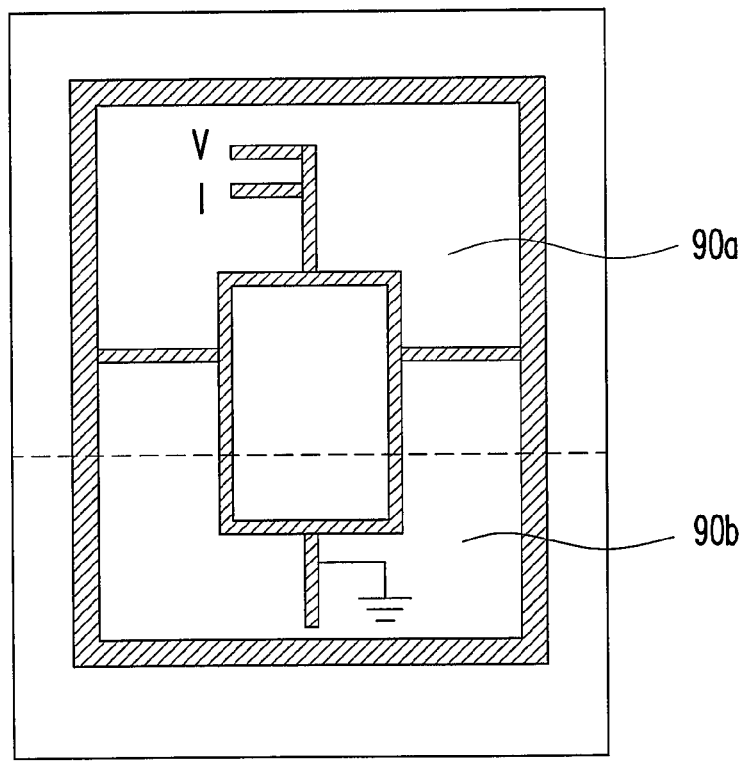
Figure 1C:
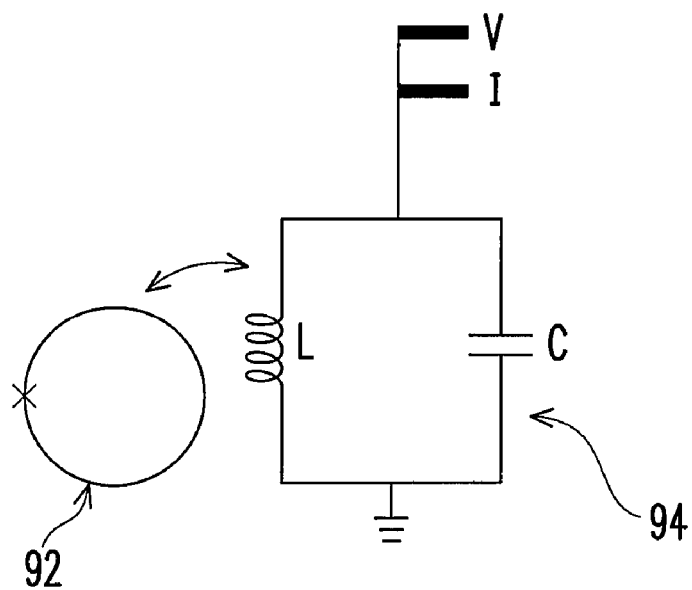

Further, a transforming element 122 is coupled to the pick-up coil set 120 for transferring the induced current "i" to a remote location, at which the induced current can be measured in high sensitivity. The induced current "i" flows through a coil loop 124 to produce an induced magnetic induction $B_2(t)$ under the physical phenomenon. In other words, it has a relation between $B_1(t)$ and $B_2(t)$, in which the information of susceptibility is carried by $B_2(t)$. Of course, the $B_2(t)$ also causes the changing of magnetic flux on the coil loop 124. The coil loop 124 can be a single loop or a solenoid. Usually, the induced magnetic induction $B_2(t)$ is small. In this consideration a current amplifier 126 or a resonant circuit instead can be, for example, included to transfer the magnetic filed to the remote location. A SQUID unit 128 can be used at that location to detect the magnetic induction $B_2(t)$. Since the SQUID unit 128 is sensitivity to the magnetic flux, the $B_2(t)$ can be precisely measured, and the susceptibility M can be obtained by calculation, for example. In general, the SQUID unit 128 includes a SQUID element, which can be a usual design as previously described in FIGS. 1A-1B and so on, as the examples.

Figure 3:
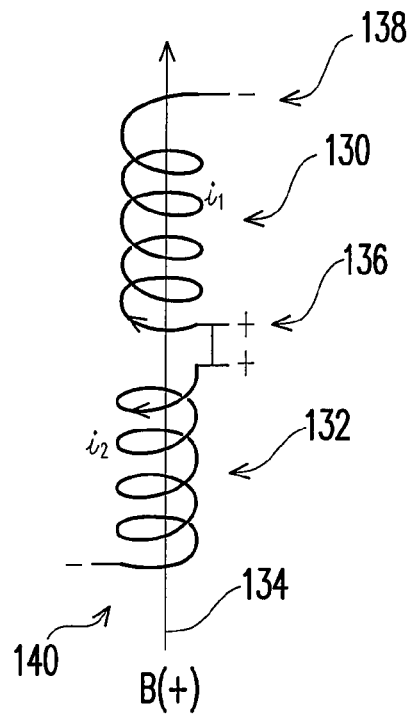
FIG. 3 is a drawing, schematically illustrating a structure of the pick-up coil, according to an embodiment of the invention.

In FIG. 2, the coil loop 124 may also pick up the background effect from the magnetic filed $B_f(t)$, not just the effect of the M on the pick-up coil set 120. However, the background effect from the magnetic filed $B_f(t)$ can be removed by a design as shown in FIG. 3, for example. In FIG. 3, the pick-up coil set can be formed by a pair of solenoids 130 and 132 coupled at in series, but with opposite wiring directions. For example, the solenoid 130 is winding clockwise from the terminal 136 to the terminal 138 wile the solenoids 132 is winding counterclockwise from the terminal 140 to the terminal 136. When an external magnetic induction B(t) 134 is applied through the solenoids 130 and 132, according to the electromagnetic phenomenon, the current $i_1$ and current $i_2$ are induced on the solenoid 130 and solenoid 132. However, due to the opposite winding direction, the current $i_1$ is flowing from the terminal 136 to the terminal 138 while the current $i_2$ is flowing from the terminal 136 to the terminal 140. As a result, the two currents $i_1$ and $i_2$ are opposite, too, and therefore cancel out each other. If the quantities of the currents $i_1$ and $i_2$ are equal, then it results in zero current between the terminals 138 and 140. In this manner, the background current can be cancelled. In accordance with the intended applications, the pick-up coil set 120 in FIG. 2 can be designed with the structure in FIG. 3. In this manner, when the magnetized material is posited in one of the solenoids, an output current can directly reflect the magnetization M(t) without including the background current. The design of FIG. 3 is more helpful in removing background current.

Figure 4:
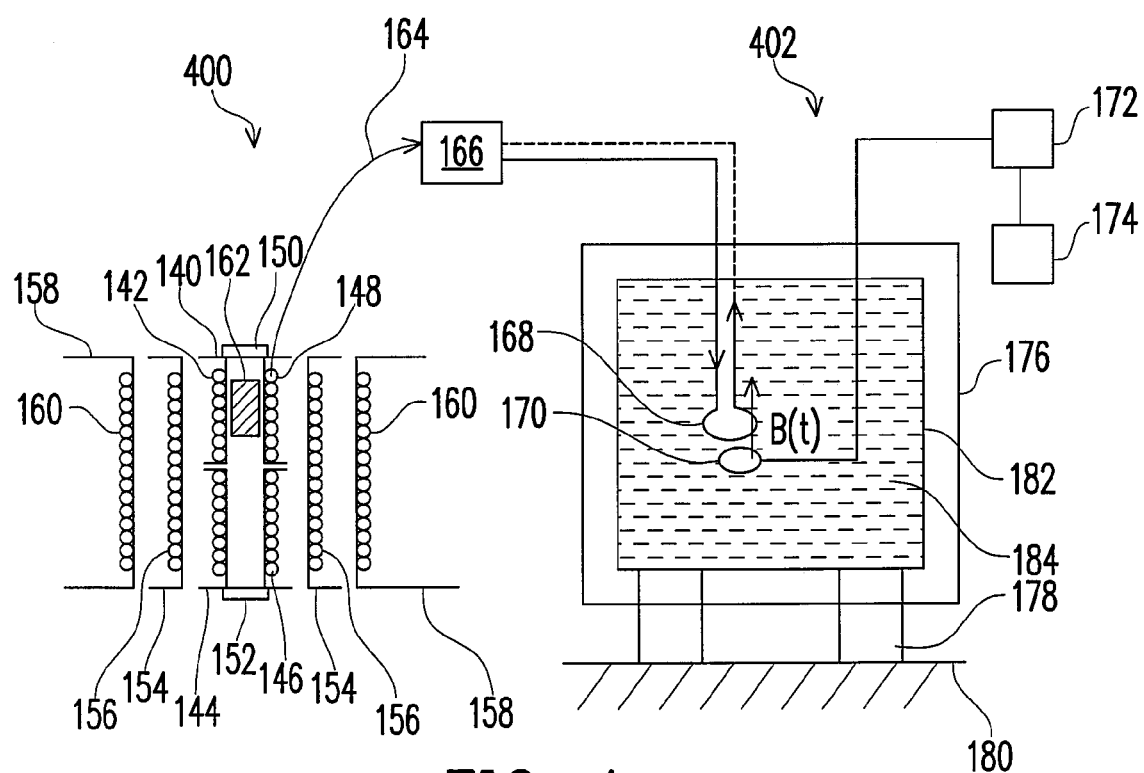
FIG. 4 is drawing, schematically illustrating a structure of the SQUID system for measuring magnetic susceptibility of material, according to an embodiment of the invention.

Based on the proceeding design mechanism, the invention proposes a SQUID system. FIG. 4 is drawing, schematically illustrating a structure of the SQUID system for measuring magnetic susceptibility of material. In FIG. 4, a SQUID-based AC magnetosusceptometry is provided as an embodiment. The design principle is based on the structure in FIG. 2. The SQUID system in general includes a magnetic-flux sourcing unit 400, having an excitation coil set (156+160) and a pick-up coil set 142. The excitation coil set in this example includes two coils 156 and 160, which are for example wound on the circular barrels 154 and 158. The coils 156, 160 can be for example a solenoid design, but the solenoid design is not the only option. In addition, the number of coils in the excitation coil set can be one or more, depending on actual operation frequency is desired. Basically, each coil is driven by a function generator to produce a magnetic induction B(t), proportional to magnetic field H(t), at a given frequency. When multiple coils are included together, then a mixed AC frequency, such as $mf_1+nf_2$, can be obtained, where m and n are integers, $f_1$ and $f_2$ are excitation frequencies. The excitation coil set is to produce a time-varying magnetic field to the sample material 162 so as to magnetize the material 162 with the magnetization M(t). The magnetization M(t) of the material 162 is to be measured, so as to obtain the AC susceptibility.

In order to sense the effect of the magnetization M(t) of the material 162, a pick-up coil 142 on the barrel 140 can detect the material 162. The magnetic induction (or magnetic field) produced from the excitation coil set can enter the pick-up coil 142 and the material 162. The material 162 is then magnetized. As previously described in FIG. 3, the pick-up coil 142 can be designed with a pair of solenoids 142, 146 with opposite winding direction. The solenoids 142 and 146 can be, for example, wound on the barrels 140 and 144. If the solenoids 142 and 146 are equal size and turns, then the background induced current can be cancelled. The net induced current is substantially just from the effect of magnetization of the material 162. The element 150 and 152 are, for example, the supporting elements to support and cover the material inside the pick-up coil. Here, the magnetic-flux sourcing unit 400 further needs some mechanical support elements and so on. The detail for mechanical support elements is not described here.

The induced current from the pick-up coil 142 can be transfer to the remote end, which can be a coil loop 168 for example, through a magnetic-field transfer route 164. When induced current "i" flows through the end coil loop 168, a magnetic induction B(t) can be according produced. The end coil loop 168 can be a single loop or a solenoid, as a design option. The induced magnetic induction/field B(t)/H(t) also forms a magnetic-field flux. Here, the induced current "i" may be small, and can be amplified by a circuit 166, such as a resonant circuit or a current amplifier. The location of the end coil 168 can be located away from the material 162.

In addition, generally, a magnetic-flux reading unit 402 is included to read the induced magnetic field. Here, at least a SQUID set 170 near the end coil 168 is used to sense the induced magnetic flux. The electronic circuit block is used to read the induced magnetic flux from the SQUID set 170. The electronic circuit block may, for example, include the SQUID electronic circuit 172 and readout electronic circuit 174. According to the information to be detected, the SQUID set 170 can be, for example, radio-frequency SQUID magnetometer, radio-frequency SQUID gradiometer, direct-current SQUID magnetometer, direct-current SQUID gradiometer, or electronic gradiometer, without specific limit. The SQUID is more sensitivity to the magnetic flux compared to the convention flux detector, so that the measuring precision and sensitivity can be improved.

Further, since SQUID is operated at a low temperature in the range pertaining to high-$T_c$ superconductive material, the SQUID is operated in a liquid nitrogen environment 184, which can be formed by a house 182. Further, the outer house 176 with magnetic and/or RF shielding function is used. Further, the sponge 178 or elastic supporting element can be used to avoid vibration. The detail for mechanical support elements is not described here.

Figure 5:
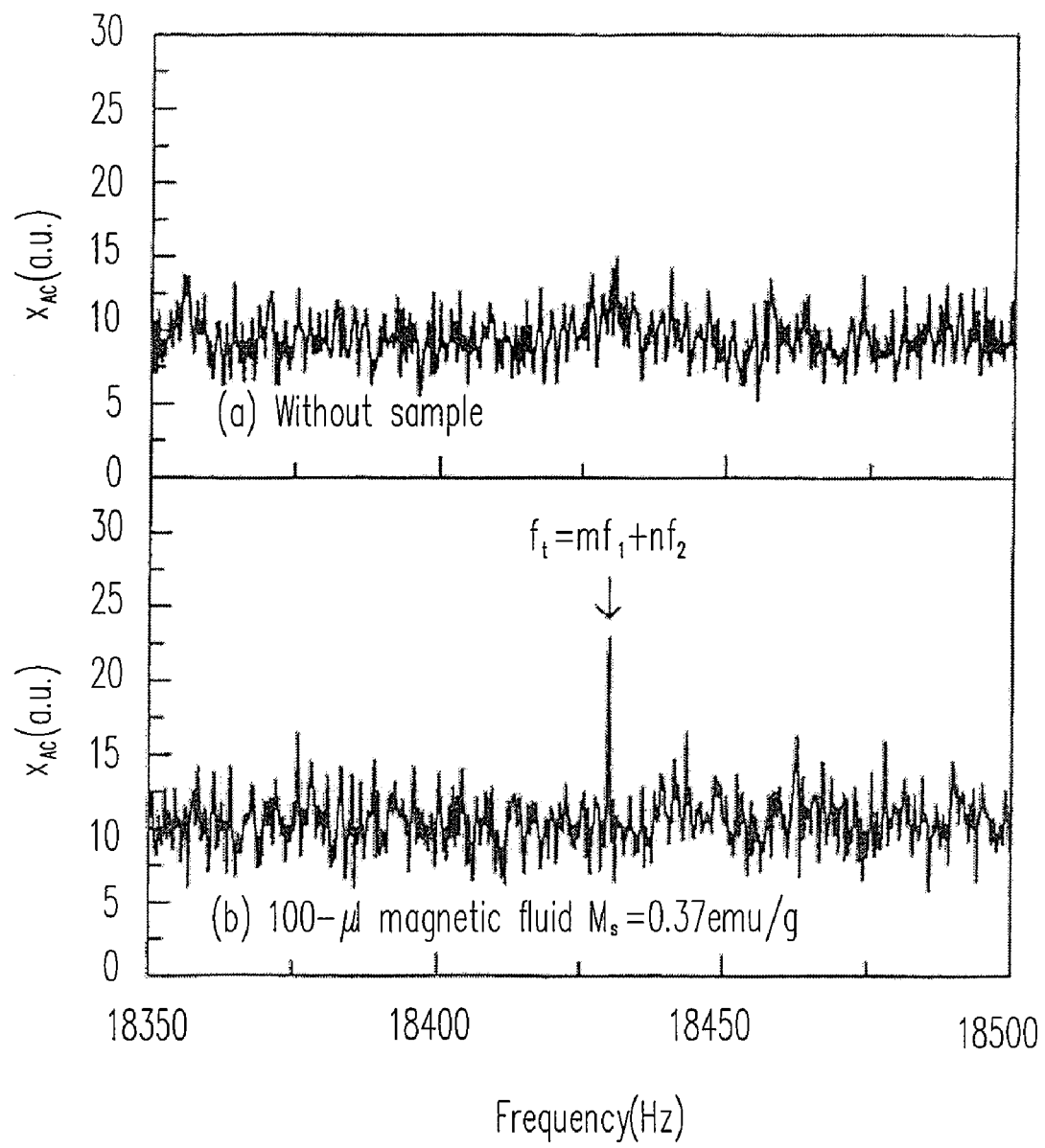
FIG. 5 is experimental results in measuring the magnetic susceptibility of material, according to an embodiment of the invention.

The invention has proposed the SQUID system to, for example, measure the AC magnetic susceptibility from a material, which can be a bio-sample and so on. The applied frequency can be obtained by a mix from at least one coil respectively with a specific frequency. FIG. 5 is experimental results in measuring the magnetic susceptibility of material, according to an embodiment of the invention. In FIG. 5, the $\chi_{AC}$ is measured with two target frequency $f=mf_1+nf_2$. The SQUID system is serving as the AC magnetosusceptometry, for example. The upper drawing is the spectrum under the situation without the material 162 while the lower drawing is the spectrum under the situation with the material 162. It can be clearly seen that a significant $\chi_{AC}$ peak is detected out. In other words, the present invention can actually work well.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. Superconductive quantum interference device (SQUID) system for measuring magnetic susceptibility of a material, comprising:
    a magnetic-flux sourcing unit, comprising an excitation coil set and a pick-up coil set, wherein the excitation coil set supplies a varying magnetic flux on the material inside and the pick-up coil set surrounds the material inside and detects an induced magnetic flux from the material;
    a magnetic-field transfer route, coupled to the pick-up coil set for transferring the induced magnetic flux to a location; and
    a magnetic-flux reading unit, comprising at least a SQUID set at the location to sense the induced magnetic flux and an electronic circuit block to read the induced magnetic flux from the SQUID set,
    wherein the excitation coil set of the magnetic-flux sourcing unit includes multiple coils driven respectively by multiple functional generators at multiple specific operation frequencies to apply the varying magnetic flux on the material.

2. The SQUID system of claim 1, wherein the magnetic-flux reading unit also converts the induced magnetic flux into a magnetic susceptibility of the material.

3. The SQUID system of claim 1, wherein the excitation coil set of the magnetic-flux sourcing unit includes one coil driven by a functional generator at a specific operation frequency.

4. The SQUID system of claim 1, wherein the specific operation frequencies include two frequency components of f1 and f2.

5. The SQUID system of claim 1, wherein the pick-up coil set includes two solenoids in series but with opposite winding directions.

6. The SQUID system of claim 1, wherein the SQUID set of the magnetic-flux reading unit is operated at a temperature for producing superconductivity.

7. The SQUID system of claim 1, wherein the magnetic-field transfer route comprises an end coil to produce the induced magnetic flux.

8. The SQUID system of claim 7, wherein the magnetic-field transfer route further comprises a resonant circuit or a current amplifier.

9. The SQUID system of claim 1, wherein the SQUID set comprises radio-frequency SQUID magnetometer, radio-frequency SQUID gradiometer, direct-current SQUID magnetometer, direct-current SQUID gradiometer, or electronic gradiometer.

10. The SQUID system of claim 1, wherein the varying magnetic flux is induced by an alternating current flowing through the excitation coil set.

11. The SQUID system of claim 1, wherein the excitation coil set also surrounds the pick-up coil set from outside, wherein the pick-up coil set receives the varying magnetic flux from the excitation coil set as well.

12. A superconductive quantum interference device (SQUID) system for measuring magnetic susceptibility, comprising:
    a pick-up coil set, posited at an environment with a varying magnetic field, wherein the pick-up coil set surrounds a measured material inside, so as to produce an induced current from the measured material;
    an excitation coil set, surrounding the pick-up coil set and supplying a varying magnetic flux on the measured material, wherein the excitation coil set includes multiple coils to produce multiple specific operation frequencies to apply the varying magnetic flux on the material;

a transforming element, coupled to the pick-up coil set for transferring the induced current to a location, wherein the induced current flows through a coil loop to produce an induced magnetic field; and a SQUID unit at the location to detecting the magnetic field.

13. The SQUID system of claim 12, wherein the pick-up coil set comprises a coil for producing the induced current according to a varying rate of magnetic flux through the coil, wherein the measured material is inside the coil being surrounded.

14. The SQUID system of claim 13, wherein the coil comprises a solenoid.

15. The SQUID system of claim 13, wherein the coil comprises a pair of solenoids in series with opposite winding directions.

* * * * *